(12) United States Patent
Schuster et al.

(10) Patent No.: US 12,715,760 B2
(45) Date of Patent: Aug. 25, 2026

(54) SOUND TEST DEVICE FOR, AND A METHOD OF, TESTING A DUT, IN PARTICULAR A MEMS MICROPHONE

(71) Applicant: Cohu GmbH, Kolbermoor (DE)

(72) Inventors: Anton Schuster, Grassau (DE); Rainer Hittmann, Großkarolinenfeld (DE); Franz Pichl, Übersee (DE); Helmut Scheibenzuber, Weyarn (DE)

(73) Assignee: COHU GMBH, Kolbermoor (DE)

( * ) Notice: Subject to any disclaimer, the term of this patent is extended or adjusted under 35 U.S.C. 154(b) by 473 days.

(21) Appl. No.: 18/337,517

(22) Filed: Jun. 20, 2023

(65) Prior Publication Data

US 2023/0416077 A1 Dec. 28, 2023

(51) Int. Cl.
*B81B 3/00* (2006.01)
*H04R 29/00* (2006.01)

(52) U.S. Cl.
CPC ......... *B81B 3/0021* (2013.01); *H04R 29/004* (2013.01); *B81B 2201/0257* (2013.01); *B81B 2203/0127* (2013.01); *H04R 2201/003* (2013.01)

(58) Field of Classification Search
CPC .......... B81B 3/0021; B81B 2201/0257; B81B 2203/0127; H04R 29/004; H04R 2201/003; H04R 29/001
See application file for complete search history.

(56) References Cited

U.S. PATENT DOCUMENTS 5,125,260 A * 6/1992 Hedeen ................ H04R 29/006 73/659
9,400,262 B2 7/2016 Doller et al.
9,674,626 B1 * 6/2017 Ebenezer ............. H04R 29/006
10,375,494 B1 * 8/2019 Chou ................... H04R 29/004
11,190,890 B2 11/2021 Khenkin et al.
11,671,776 B2 * 6/2023 Schuster .............. H04R 29/004 381/58
2007/0139067 A1 * 6/2007 Beier ................. G01R 31/2831 324/756.07

(Continued)

FOREIGN PATENT DOCUMENTS

EP 2 672 283 A1 12/2013
TW 202201979 A 1/2022

OTHER PUBLICATIONS

Extended European Search Report dated Dec. 7, 2022 for European Appl. No. 22181073.2.

(Continued)

*Primary Examiner* — Oyesola C Ojo

(74) *Attorney, Agent, or Firm* — Knobbe Martens Olson & Bear, LLP

(57) ABSTRACT

A sound test device for testing a DUT in particular a MEMS microphone, comprises a sound chamber a socket unit and a sound generator unit, wherein the sound generator unit includes a speaker comprising a speaker membrane, an opening, and a reference microphone comprising a microphone membrane wherein the opening is adapted to receive a DUT opening of the DUT and wherein the microphone membrane and the opening are arranged to opposing each other, and the socket unit includes the at least one contact element being adapted to contact to a contact terminal of the DUT, and wherein the sound chamber is limited by the speaker membrane, the microphone membrane, and the opening.

15 Claims, 6 Drawing Sheets

(56) References Cited

U.S. PATENT DOCUMENTS

| | | | | |
|---|---|---|---|---|
| 2010/0290634 | A1* | 11/2010 | Schaule | H04R 29/004 381/58 |
| 2011/0226544 | A1* | 9/2011 | Viehmann | H04R 29/004 181/198 |
| 2013/0140656 | A1* | 6/2013 | Pahl | B81B 7/0061 438/51 |
| 2013/0321011 | A1* | 12/2013 | Binder | G01R 31/003 324/750.01 |
| 2014/0079228 | A1* | 3/2014 | Doller | H04R 29/004 381/58 |
| 2014/0328489 | A1* | 11/2014 | Ziegler | H04R 29/004 381/58 |
| 2015/0117654 | A1* | 4/2015 | John | H04R 29/004 381/59 |
| 2016/0198276 | A1* | 7/2016 | Stetson | H04R 29/004 381/58 |
| 2019/0394550 | A1* | 12/2019 | Mennitt | H04R 25/30 |
| 2020/0196047 | A1* | 6/2020 | Irii | H04R 19/005 |
| 2021/0120352 | A1* | 4/2021 | Khenkin | H04R 29/004 |
| 2021/0377679 | A1* | 12/2021 | Lo | H04R 1/2803 |
| 2021/0377682 | A1* | 12/2021 | Rusconi Clerici Beltrami | H04R 29/005 |

OTHER PUBLICATIONS

Office Action and Search Report dated Apr. 30, 2024, for Taiwan Patent Application No. 112121604.

* cited by examiner 101
115
119
100
114o
114
110
111
116
113_1
113_2
113
113_3
112
120
121
122
122o
122c
125
126
128_4
129
128_2
127_4
130
127_1
127_2
128_1
128_3
127_3
124

SOUND TEST DEVICE FOR, AND A METHOD OF, TESTING A DUT, IN PARTICULAR A MEMS MICROPHONE

This application claims the benefit of the filing date of European Patent Application EP 22181073.2 filed Jun. 24, 2022, the disclosure of which is hereby incorporated herein by reference.

FIELD OF THE INVENTION

The invention is related to a sound test device for testing a DUT, in particular a MEMS microphone, and a method of testing a DUT, in particular a MEMS microphone, using the sound test device.

Automated test equipment is widely used for testing semiconductor devices, electronic components, or so called DUTs (device under test). These DUTs can be miniaturized microphones, in particular MEMS microphones. There is an ever-growing demand for high quality microphones used in devices, such as mobile phones and the like. However, MEMS microphones used in mobile devices may require a sound test or sound calibration to increase the demanded quality of the MEMS microphones used in the mobile devices.

DESCRIPTION OF THE INVENTION

There may be a need to improve a sound test or a sound calibration of DUTs, in particular, of MEMS microphones.

According to a first aspect, a sound test device for testing a DUT, in particular a MEMS microphone, comprises a sound chamber, a socket unit, and a sound generator unit, wherein the sound generator unit includes a speaker comprising a speaker membrane, an opening, and a reference microphone comprising a microphone membrane, wherein the opening is adapted to receive a DUT opening of the DUT, and wherein the microphone membrane and the opening are arranged to opposing each other, and the socket unit includes the at least one contact element being adapted to contact to a contact terminal of the DUT, and wherein the sound chamber is limited by the speaker membrane, the microphone membrane, and the opening.

According to a further aspect, a method for testing a DUT, in particular a MEMS microphone, comprises providing a sound chamber, a socket unit, and a sound generator unit, wherein the sound generator unit includes a speaker comprising a speaker membrane, an opening, and a reference microphone comprising a microphone membrane, and wherein the microphone membrane and the opening are arranged to opposing each other, wherein the socket unit includes at least one contact element, wherein the sound chamber is limited by the speaker membrane, the microphone membrane, and the opening, and wherein the method further comprises:

Receiving a DUT opening of the DUT on the opening, and

Contacting the least one contact element to at least on contact terminal of the DUT, when receiving the DUT.

The expression "sound test device" may denote a piece of equipment designed to evaluate a component processing longitudinal pressure wave. The component which processes a sound input to generate electrical signals may be called DUT, and may, in particular, be a MEMS microphone. The sound test device may serve the special purpose or perform the special function of proofing and/or calibrating the DUT or MEMS microphone. The expression "sound chamber" may denote an enclosed space or cavity being designed for the purpose of the sound testing. The expression "socket unit" may denote an apparatus serving to establish an electrical contact with the DUT and to electrically transmit signals received from the DUT. The socket unit may comprise a socket and a cable, as well as a plug attached to an end of the cable for a further electrical connection to a so-called tester. The expression "contact element" may refer to a part of the socket unit for repeatedly contacting to contact portions of a DUT. The expression "contact terminals" may denote multiple portions of the DUT for electrically coupling and transmitting signals to another device.

The expression "sound generator unit" may denote a piece of equipment or an arrangement of multiple pieces of equipment to generate or produce sound. The generated sound may have proper characteristics to serve as a basis for the sound testing. The piece of equipment generating sound is often named "loud speaker" or "speaker". The speakers may, in particular, be piezo speakers or piezo loud speakers. The expression "reference microphone" may denote a microphone, i.e. an instrument for translating sound into electrical signals, being highly accurate and/or allowing to serve as a standard for sound calibration. The term "membrane" may denote a typically thin boundary layer, allowing for a microphone to capture sound signals, and allowing for a speaker to generate sound. The term "opening" may refer to a hole being encircled by a solid material. The expression "DUT opening" may therefore refer to an opening of the DUT, and in particular to the opening of the DUT where sound shall be received to convert the received sound or sound impulse to an electrical signal. The expression "oppose each other" may denote an arrangement where active parts of two pieces of equipment face each other. Therefore, the expression "the microphone membrane and the opening are arranged to opposing each other" may denote that the microphone membrane and the opening may face each other with nothing in between.

According to a gist of the invention a sound test device comprises an opening on which a DUT may be placed directly with its DUT opening. A microphone membrane may lie opposingly relative to the opening and therefore the microphone membrane may also oppose the DUT opening. A speaker membrane may be arranged in an angle, in particular in an angle of 90° relative to a line between the opposing opening and the microphone membrane. The speaker membrane, the microphone membrane, and the opening may form the sound chamber, when the DUT is arranged with its DUT opening on the opening of the sound generator unit.

Aspects of the Invention are as Follows:

According to an exemplary embodiment, the sound test device further comprises an insert comprising the opening, wherein the insert further comprises a hollow conical shape tapering towards the opening and limiting the sound chamber.

The term "insert" may denote a piece of material being designed for fitting into a recess. The insert may be arranged on a top end of the sound generator unit towards the socket unit. The expression "hollow conical shape" may denote a cone shape having an empty inside. The expression "tapering towards an opening" may denote a geometric form progressively narrowing toward one end, which in this case is the opening of the insert. With the insert tapering towards the DUT and/or the opening of the sound generator unit, the space within the sound chamber may be reduced and with the hollow conical shape the sound chamber may become symmetrical at any point along the third line inside the hollow conical shape.

According to an exemplary embodiment of the sound test device, the insert is made of an electrically non-conductive ceramic material.

The insert may allow for insulating electrically conductive parts of the socket unit and the sound generator unit against each another. The conductive parts of the socket unit may lie on the insert so that the insert supports the conductive parts and avoids a short cut of the conductive parts of the socket unit.

According to an exemplary embodiment of the sound test device, encloses the sound chamber a space with a maximal free length of 16 mm.

The maximal free length may, particular be, 12 mm, 10 mm, 8 mm, or 6 mm. Herein, the expression “the sound chamber encloses a space” may denote a closed cavity which may in which the sound may propagate. The expression “maximal free length” may denote a dimension of (straight) length which may not exceed a certain value without being limited by solid chamber material of the sound chamber. The maximal free length of 16 mm, or less, may allow for suppressing and/or avoiding standing waves with wavelength longer than the required minimal wavelength for proper testing. I.e. if the wavelength would be longer, distortion is neglectable and shorter wavelengths which would produce standing waves are not, or outside, of a desired spectrum and will therefore not be generated by the speakers, anyway.

According to an exemplary embodiment of the sound test device, comprises the sound chamber at least one speaker cave, the at least one speaker cave extending radially outwards and above the microphone membrane and towards the speaker membrane so that the sound chamber is further limited by the at least one speaker cave.

A diameter of the reference microphone may be to long for placing the speaker with the speaker membrane directly to a centre of the sound chamber. The speaker and the speaker membrane may be arranged to extend parallel with a main axis of the reference microphone. The expression “speaker cave” may denote a hollow space extending towards the centre of the sound chamber, or the microphone membrane on one side, and towards the speaker membrane on the other side. The sound may therefore be directed from the speaker membrane towards the centre of the sound chamber between the DUT opening and the microphone membrane. Furthermore, the speaker cave may shape and limit the sound chamber. According to an exemplary embodiment of the sound test device, comprises the sound generator unit an insulation the insulation being placed on the speaker membrane and said insulation comprising an insulation opening, so that the speaker membrane freely transmits sound through the insulation opening radially inwards to a centre of the sound chamber.

The insulation opening may have a cross-sectional area comparable and mating with a cross-sectional area of the speaker cave. The sound being emitted by the speaker membrane may be transmitted radially inwards through the speaker cave to the centre of the sound chamber.

According to an exemplary embodiment of the sound test device, comprises the socket unit a ground ring contact being located on the opening, and wherein the ground ring contact is adapted to electrically contact to a ring contact of the DUT and to form an airtight seal with the ring contact. The expression “ground ring contact”, and “ring contact” may denote a circularly closed (electrical) conductor, wherein the ground ring contact may be a part of the socket unit, and the ring contact may be a part of the DUT. The expression “airtight seal” may denote that an arrangement may be sufficiently impermeable to air. Wherein sufficiently may denote, that the sound test may be suitable in terms of accuracy if the airtight seal has a certain value. The ground ring contact of the socket unit and the ring contact of the DUT may match and may allow for an airtight seal while also the space may be minimized. When the DUT is pressed into the socket unit for contacting, then the conjunction between the ground ring contact and the ring contact may also become airtight.

According to an exemplary embodiment of the sound test device, form the ground ring contact and the opening an airtight seal, when the ground ring contact is pressed onto the opening.

The force exerted on the DUT, e.g. exerted by a pogo pin, may press the DUT towards the socket unit, thus the ring contact of the DUT will be airtightly lying on the ground ring contact of the socket unit, and further the force exerted may press in turn the ground ring contact of the socket unit onto the insert opening of the insert, so that also this joint becomes also airtight. According to an exemplary embodiment comprises the sound test device a contact plate and an electronic component, in particular a capacitor, is arranged on the contact plate to couple to the at least one contact element. According to an exemplary embodiment of the sound test device, comprises the socket unit a contact plate wherein the contact plate is integrally formed with the ground ring contact.

According to an exemplary embodiment of the sound test device is the at least one contact element of the socket unit integrally formed with the contact plate.

The expression “contact plate” may denote a flat piece if material including electrically conductive parts. The expression “integrally formed” may here denote, that portions of the contact plate may be non-conductive and other portions of the contact plate may be conductive, wherein both portions may be fixedly (mechanically) connected. Using a contact plate as a flat piece including conductive and non-conductive portions may help to minimize a height of the sound test device and as a consequence may minimize the dimensions of the sound chamber and may help to reduce the maximal free length, so that a test or calibration of the DUT may be in turn be more accurate over a wider variety of wavelength and, in particular, in the range towards smaller wavelengths.

The at least one contact element integrally formed with the contact plate may be a flexible electrically conductive piece, so that the contact elements may flexibly contact to the contact terminals of the DUT.

According to an exemplary embodiment of the sound test device comprises the socket unit a contact socket including at least one contact pin, the at least one contact pin being adapted to contact to at least one opposite contact terminal of the DUT the at least one opposite contact terminal lying on an opposite side of the DUT opening.

As an alternative or additionally, may the DUT have contact terminals on an opposite side of the DUT opening. The socket unit may comprise a contact socket with contact pins which allow for contacting the DUT from this opposite side. The sound test device may comprise the contact socket and the contact plate for contacting a DUT on different sides simultaneously.

According to an exemplary embodiment of the sound test device comprises the socket unit a socket cable formed as a flex cable and terminating in a socket plug to electrically transmit signals coming from the contact terminals of the DUT.

The expression "a socket cable formed as a flex cable" may denote a cable being used to electrically connect the socket and the cable being flexible. The expression "terminating in a socket plug" may here denote an end of the cable formed to couple to a connector. The flex cable may extend from the contact plate and/or the contact socket.

According to an exemplary embodiment, the sound test device further comprises a pogo pin being adapted to press the DUT onto the contact unit.

The expression "pogo pin" may denote a typical piece of equipment in the field of ATE (automated test equipment) being an elastic straight element serving usually to contact and to exert a resilient force. Usually pogo pins are used to flexibly connect to contact terminals of a DUT. Contrary to the usual application of a pogo pin, here, the pogo pin is used for exerting a force onto a housing or moulding of on top of a DUT which in turn presses the DUT towards the contact unit and contacts the contact terminals of the DUT towards the contact elements of the contact unit. This unusual application is based on the finding, that the force exerted by the pogo pin is sufficient so that the contact terminals of the DUT and the contact elements of the contact plate and/or of the contact socket are sufficient electrically connected for testing.

According to an exemplary embodiment of the sound test device is the pogo pin adapted to exert a force on the DUT the exerted force being adapted to form the airtight seal between the ring contact and the ground ring contact and/or exerts the force to form the airtight seal between the ground ring contact and the opening.

In addition to the unusual application of the pogo pin, the force of the pogo pin may also be sufficient to establish an airtight seal between the ring contact and the ground ring contact and/or between the ground ring contact and the opening.

According to an exemplary embodiment of the sound test device comprises the sound generator unit a further, second speaker comprising a further, second speaker membrane, so that the sound chamber is further limited by the further, second speaker membrane.

According to an exemplary embodiment of the sound test device do the speaker membrane, and the further, second speaker membrane oppose each other.

The speaker may be a first speaker and the further speaker may be a second speaker. The first speaker and the second speaker may form a first pair of speakers. According to an exemplary embodiment of the sound test device are the first speaker and the second speaker arranged in one first line and oppose each other. The first speaker and the second speaker may be arranged in one first line and oppose each other symmetrically. The expression "symmetrically in one first line" may denote an arrangement being mirror symmetrically in relation to the line or straight.

According to an exemplary embodiment of the sound test device comprises the sound generator unit a further, third speaker comprising a third speaker membrane, so that the sound chamber is further limited by the third speaker membrane.

The first speaker, the second speaker, and the third speaker may be arranged to oppose each other in a skew manner, i.e. an angle between the first speaker and the second speaker, the second speaker and the third speaker, and the third speaker and the first speaker may be 120° each, or the three angles may have each a different value or a value which differs only a few degrees or seconds from 120°.

According to an exemplary embodiment of the sound test device comprises the sound generator unit a further, fourth speaker comprising a fourth speaker membrane, so that the sound chamber is further limited by the fourth speaker membrane.

According to an exemplary embodiment of the sound test device do the third speaker membrane, and the fourth speaker membrane oppose each other. The third speaker and the fourth speaker may form a second pair of speakers. According to an exemplary embodiment of the sound test device are the third speaker and the fourth speaker arranged in one second line and oppose each other. The first speaker and the second speaker may be arranged in one first line and oppose each other symmetrically. The expression "symmetrically in one second line" may denote an arrangement being mirror symmetrically in relation to the line or straight.

According to a further gist of the invention a sound test device comprises four speakers for generating sound which speakers are arranged symmetrically in one plane facing towards each other in pairs. That is, the four speakers facing to each other are arranged each on one centre of one different of the four sides of a rectangle having four equal sides. As a consequence, the four speakers face to a centre, the crossing point, from which all four speakers have an equal distance. The first line may run between the centre of the first speaker to the centre of the third speaker. The second line may run from the centre of the second speaker to the centre of the fourth speaker. A crossing point of the first line and the second line may be also crossed by a third line running from the centre of the reference microphone to the centre of the opening of the socket unit.

With a symmetrical arrangement of the four speakers and of the reference microphone and the opening of the socket unit, the sound chamber may allow for a more accurate sound generation, as well as a more accurate sound measurement for each of the components involved. The DUT may be positioned on the opening of the socket unit, so that the sound chamber may be constituted by the four speakers, the reference microphone, and the DUT or the opening of the socket unit, respectively.

According to an exemplary embodiment of the sound test device are the microphone membrane and the opening arranged to oppose each other symmetrically, wherein a third line lies central relative to the microphone membrane and the opening, and wherein the third line crosses a crossing point of the first line and the second line. The first, the second, and the third line may include three angles of 90° relative to each other.

The expression "lies central relative to the membrane and the opening" may denote a position of a point in a space, here the sound chamber, so that the point has the same distance towards any point of one or to circles, the first circle being formed by the outer edge of the membrane and the second circle being formed by the circular opening of the socket unit. The crossing point may mark a centre of the first and second pair of speakers. In addition, the crossing point may be centred relative to the membrane of the reference microphone and may be centred relative to the opening of the sound generator unit. The crossing point may be located on the third line running centred from the membrane to the opening. I.e. the crossing point has not necessarily the same distance from the membrane and from the opening but is centred relative to the membrane and the opening in a way that the crossing point lies on the third line running between the centre of the membrane and centre of the opening.

According to an exemplary embodiment of the sound test device is a first distance between the first speaker and the second speaker, and/or a second distance between the third speaker and the fourth speaker identical. The first distance and the second distance being identical may further symmetrize the sound test device, so that the four speakers of the first and second pair of speakers may be controlled equally. The four speakers may be identical in their specifications.

According to an exemplary embodiment comprises a sound test unit a device carrier, a pressing plate, and a plurality of sound test devices according to any of the exemplary embodiments, wherein the device carrier is adapted to carry a plurality of DUTs in a corresponding plurality of receptacles, and the pressing plate holds each of the pogo pins, wherein the pressing plate is adapted to press the plurality of pogo pins onto the plurality of DUTs.

The expression "sound test unit" may denote an apparatus comprising at least two sound test devices. The expression "device carrier" may denote a piece of equipment for holding and transporting DUTs. The expression "pressing plate" may denote a flat piece which in this context may hold a plurality of pogo pins on one level and with a certain distance from one pogo pin to a neighbouring pogo pin. The term "receptacles" may denote a place where the DUTs are received and or held by the device carrier. The device carrier may comprise slopes for centring the DUT on the socket. At least two slopes may be arranged skew, so that the DUT is forced in two dimensions of a main plane of the DUT while rectangularly being pressed towards the socket unit. According to an exemplary embodiment of the sound test unit are the sound test devices arranged in two rows adjacent to each other, wherein a first DUT board, and a second DUT board are mounted to an outside of the two rows of the sound test devices for transmitting signals from the socket units to a tester and for transmitting signals to the sound generator units. According to an exemplary embodiment comprises a sound test module a module base and a plurality of sound test units according to any of the exemplary embodiments, wherein the plurality of sound test units is mounted inside the module base, and the plurality of sound test devices are connected to a plurality of base connectors via the plurality of first and second DUT boards.

The expression "sound test module" may denote an apparatus comprising at least two sound test units. The expression "module base" may denote a support designed to hold and/or contain at least two sound test units. The expression "base connector" may denote a female socket part to be connected with a (male) plug.

According to an exemplary embodiment comprises the sound test module: mounting brackets and/or alignment pins for holding and pressing the plurality of pressing plates onto the corresponding plurality of device carriers. According to an exemplary embodiment comprises the sound test module further an absorber box for receiving the module base including the plurality of sound test units, for preventing sound travelling towards the plurality of sound chambers.

The expression "absorber box" may denote a closed cabin preventing sound being transmitted through its walls.

According to an exemplary embodiment comprises the method further: Providing a pogo pin. The method may further comprise: Pressing the DUT onto the socket unit by the pogo pin.

It has to be noted that embodiments of the invention have been described with reference to different subject matters. In particular, some embodiments have been described with reference to apparatus type claims whereas other embodiments have been described with reference to method type claims. However, a person skilled in the art will gather from the above and the following description that, unless other notified, in addition to any combination of features belonging to one type of subject matter also any combination between features relating to different subject matters, in particular between features of the apparatus type claims and features of the method type claims is considered as to be disclosed with this application.

Further embodiments of the invention are disclosed in the appending figures.

BRIEF DESCRIPTION OF THE DRAWINGS

The aspects defined above and further aspects of the present invention are apparent from the examples of embodiment to be described hereinafter and are explained with reference to the examples of embodiment. The invention will be described in more detail hereinafter with reference to examples of embodiment but to which the invention is not limited.

FIG. 3A shows detail A of the sound test device as shown with FIG. 2

FIG. 3B shows a cross-sectional view of a sound test device in another embodiment

DETAILED DESCRIPTION

Figures 1A, 1B, 1C:
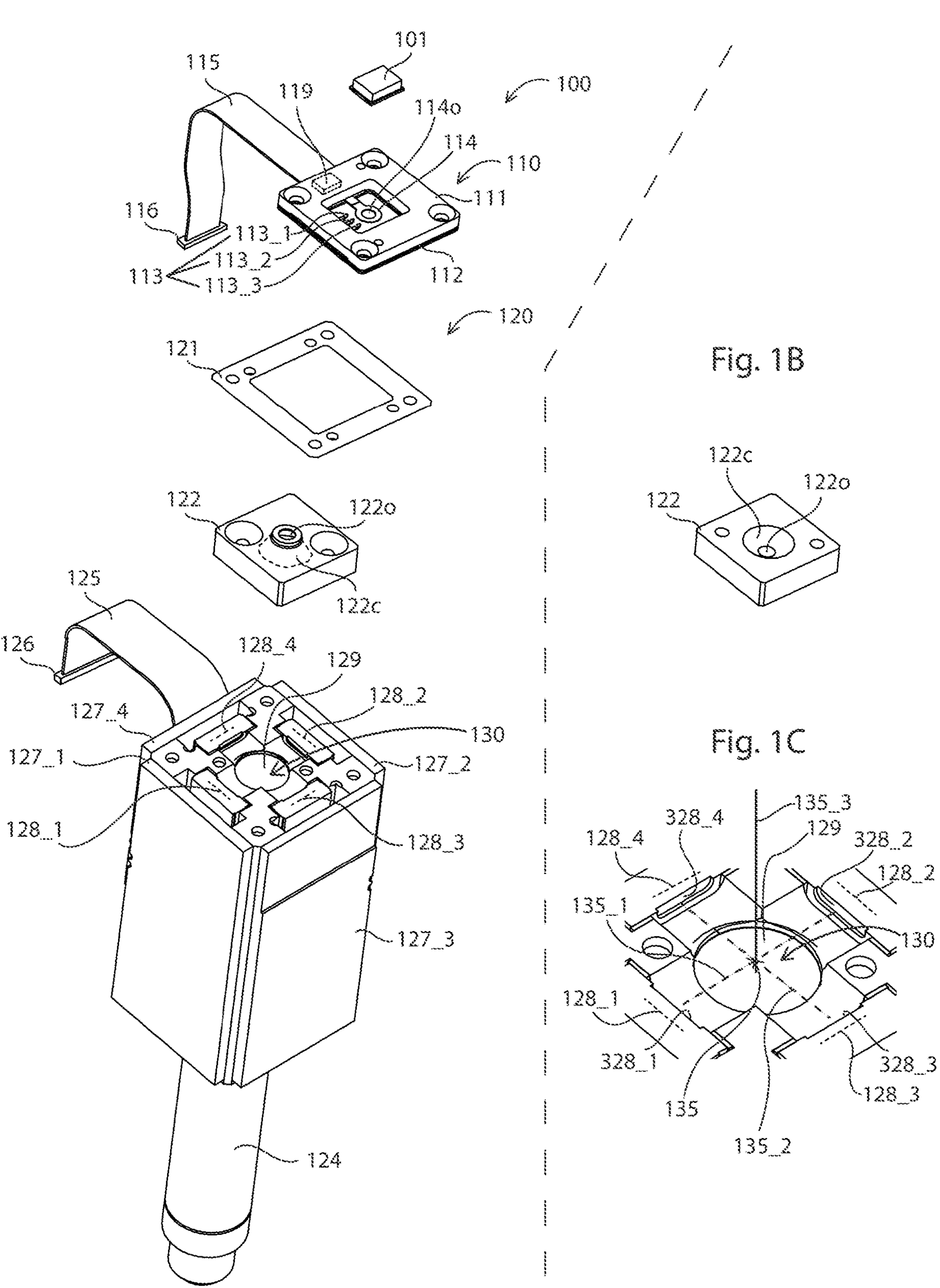
FIG. 1A shows an exploded view of a sound test device
FIG. 1B shows a rotated view of an insert
FIG. 1C depicts the first line and the second line intersecting at a point

The illustrations in the drawings are schematic. It is noted that in different figures similar or identical elements are provided with the same reference signs.

It should be noted that the term "comprising" does not exclude other elements or steps and "a" or "an" does not exclude a plurality. Also elements described in association with different embodiments may be combined. It should also be noted that reference signs in the claims should not be construed as limiting the scope of the claims.

FIG. 1A shows an exploded view of a sound test device 100 for testing a DUT 101, in particular, a MEMS microphone 101. The sound test device 100 comprises a socket unit 110 and a sound generator unit 120. The socket unit 110 may comprise a plurality of contact elements 113_1, 113_2, 113_3 extending towards an inside opening of a contact plate 112. Further, the socket unit 110 may comprise a ground ring contact 114 also extending to the inside of the contact plate 112. The ground ring contact 114 may comprise a ring opening 114*o*. A flex socket cable 115 may extend from the contact plate 112 outwards and the flat flex socket cable 115 may terminate to a socket plug 116. A socket cover plate 111 may be attached to a top side of the contact plate 112. An electronic component, in particular a capacitor 119, may be placed on the contact plate 112 and may conductively couple with the socket cable 115 and with at least one of the plurality of contact elements 113_1, 113_2, 113_3. The socket cover plate 111 may comprise a recess and may cover the capacitor 119. The socket cover plate 111 may also allow for proper positioning a device carrier (see FIG. 2) and as a consequence the DUT 101 may align properly with the contact elements 113 and the ground ring contact 114 of the contact plate 112 (see also FIG. 3, FIG. 7 and FIG. 8). The sound generator unit 120 may comprise a first speaker 128_1 and a second speaker n_128_2 (each of the speakers indicated with the respective dashed lines) opposing each other in a main plain of a sound chamber 130. Further, a third speaker n_128_3 and a fourth speaker 128_4 (also indicated with respective dashed lines) may oppose each other in the same main plain of the sound chamber 130, or the main plain of the first speaker 128_1 and the second speaker n_128_2, respectively. However, the first speaker 128_1 and the second speaker n_128_2 lying opposingly in one first line 135_1 may be positioned rectangularly in relation to the third speaker n_128_3 and the fourth speaker 128_4 similarly lying opposingly in one second line 135_2 to each other (see FIG. 1C). Thus, the first, second, third, and fourth speakers 128_1, 128_2 128_3, 128_4 may surround with equidistance a centre of the sound chamber 130 in the same main plane.

A microphone opening 129 may be formed in the centre of the sound chamber 130 to which microphone opening 129 a reference microphone 124, in particular a low noise reference noise microphone 124, may extend. A sound generator cable 125, in particular formed as a flat flex cable, may extend from one side, e.g. from the fourth speaker 128_4, or as an alternative from any other of the first, second, or third speaker 128_1, 128_2, 128_3, to the outer side of the sound test device 100.

The sound generator cable 125 may terminate to a sound generator plug 126. Adjacent towards each of the first, the second, the third, and the fourth speaker 128_1, 128_2, 128_3, 128_4 there may be attached a first, a second, a third, and a fourth cover plate 127_1, 127_2, 127_3, 127_4, and each of the four cover plate 127_1, 127_2, 127_3, 127_4 may extend basically parallel to the reference microphone 124. Whereas the first, the second, the third, and the fourth speaker 128_1, 128_2 128_3, 128_4 may surround the sound chamber 130 on each lateral side, and the microphone opening 129 may extend to a bottom of the sound chamber 130, an insert 122 may be located on the top of the sound chamber 130.

The insert 122 may have a hollow conical opening 122*c* opposite to the microphone opening 129 and, hence, lies on top of the sound chamber 130 in this regard. The conical opening 122*c* may have a diameter similar to (and directing towards) the sound chamber opening 129 and may taper further to the top of the sound chamber 130, where the conical opening 122*c* terminates to form an insert opening 122*o* for abutting to a bottom side of the ground ring contact 114 of the contact unit 110. An insulation layer 121, in particular made of Kapton®, may surround the insert 122 and may be positioned between a bottom side of the contact plate 112 and a top end of the sound generator unit 120 allowing for electrically insulating the socket unit 110 and the sound generator unit 120. Also, for the purpose of electrical insulation, the insert 122 may be made of a non-conductive material, such as a non-conductive ceramic material.

FIG. 1B shows a rotated view of the insert 122 and may depict more clearly the conical opening 122*c* tapering towards the smaller insert opening 122*o*.

FIG. 1C shows the first line 135_1 and the second line 135_2 intersecting at a point 135. The first, second, third, and fourth speakers 128_1, 128_2, 128_3, 128_4 may be equidistant to the point 135 and the point 135 may be centred within the microphone opening 129. As a consequence, the reference microphone 124 (see FIG. 1A and the following FIG. 2) may be central in relation to the first, second, third, and fourth speakers 128_1, 128_2, 128_3, 128_4. The first line 135_1, the second line 135_2, and a third line 135_3 intersect at the point 135 and the three lines may be rectangular to each other. The third line 135_3 may be perpendicularly extending from the centre of the microphone opening (or a microphone membrane 324 of the reference microphone 124, see FIG. 3A, respectively). Furthermore, each of the four speaker 128_1, 128_2, 128_3, 128_4 may be located in a respective speaker cave 328_1, 328_2, 328_3, 328_4. Therefore, the speakers 128_1, 128_2, 128_3, 128_4 are indicated by the respective dashed lines, as mentioned with FIG. 1A. (A cross-sectional view shown in FIG. 3A may show the construction more clearly.)

Figure 2:
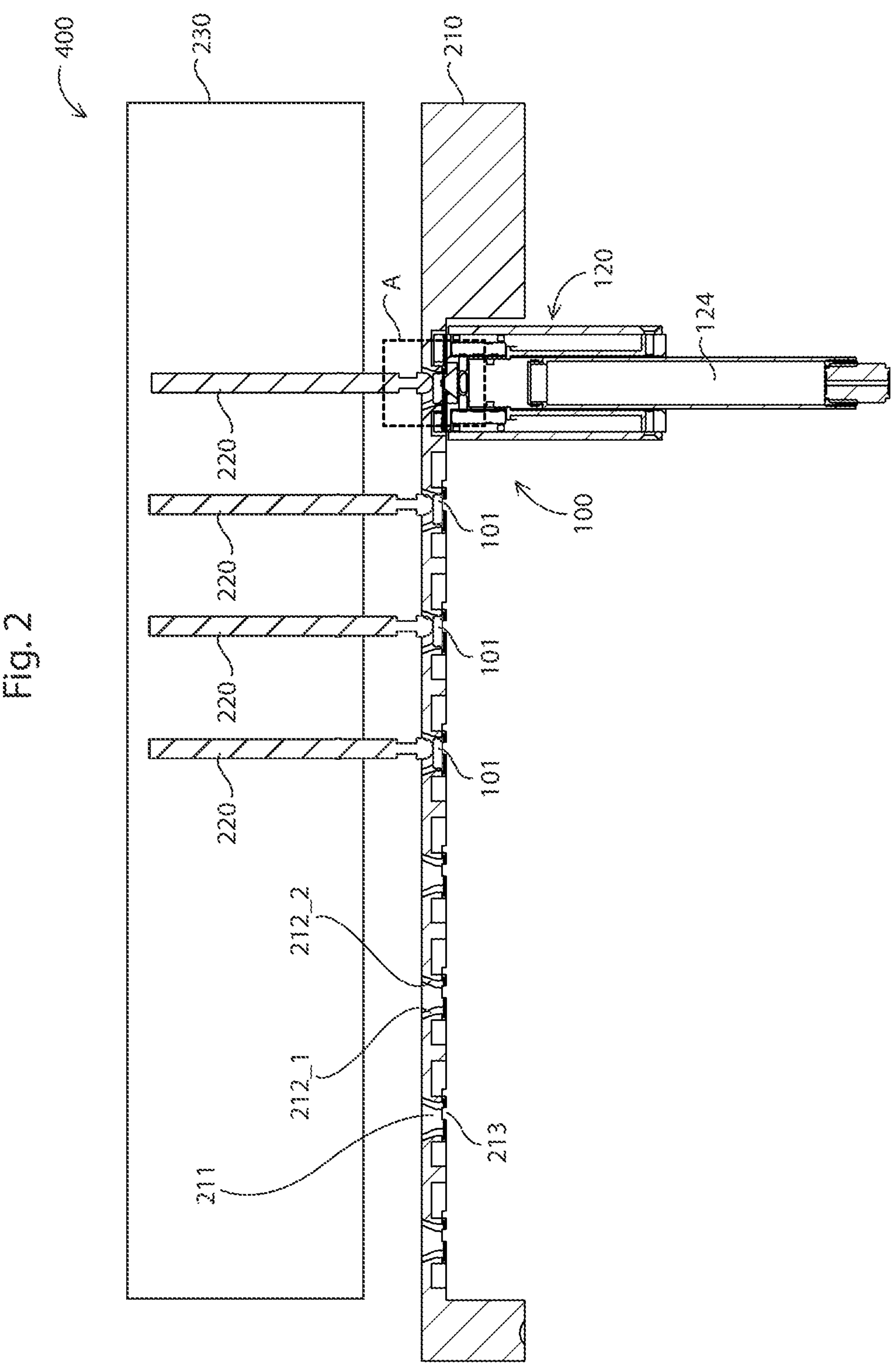
FIG. 2 shows in a cross-sectional view a device carrier and a sound test device

FIG. 2 shows in a cross-sectional view a device carrier 210 for receiving a plurality of DUTs 101 in a respective plurality of receptacles 211 from a top side of the device carrier 210. Each receptacle 211 may comprise at least a first slope 212_1 and a second slope 212_2 for centring one of the DUTs 101 in one of the receptacles 211. Each receptacle 211 may comprise at least one carrier opening 213 on a bottom of the device carrier 210.

Figures 3A, 3B:
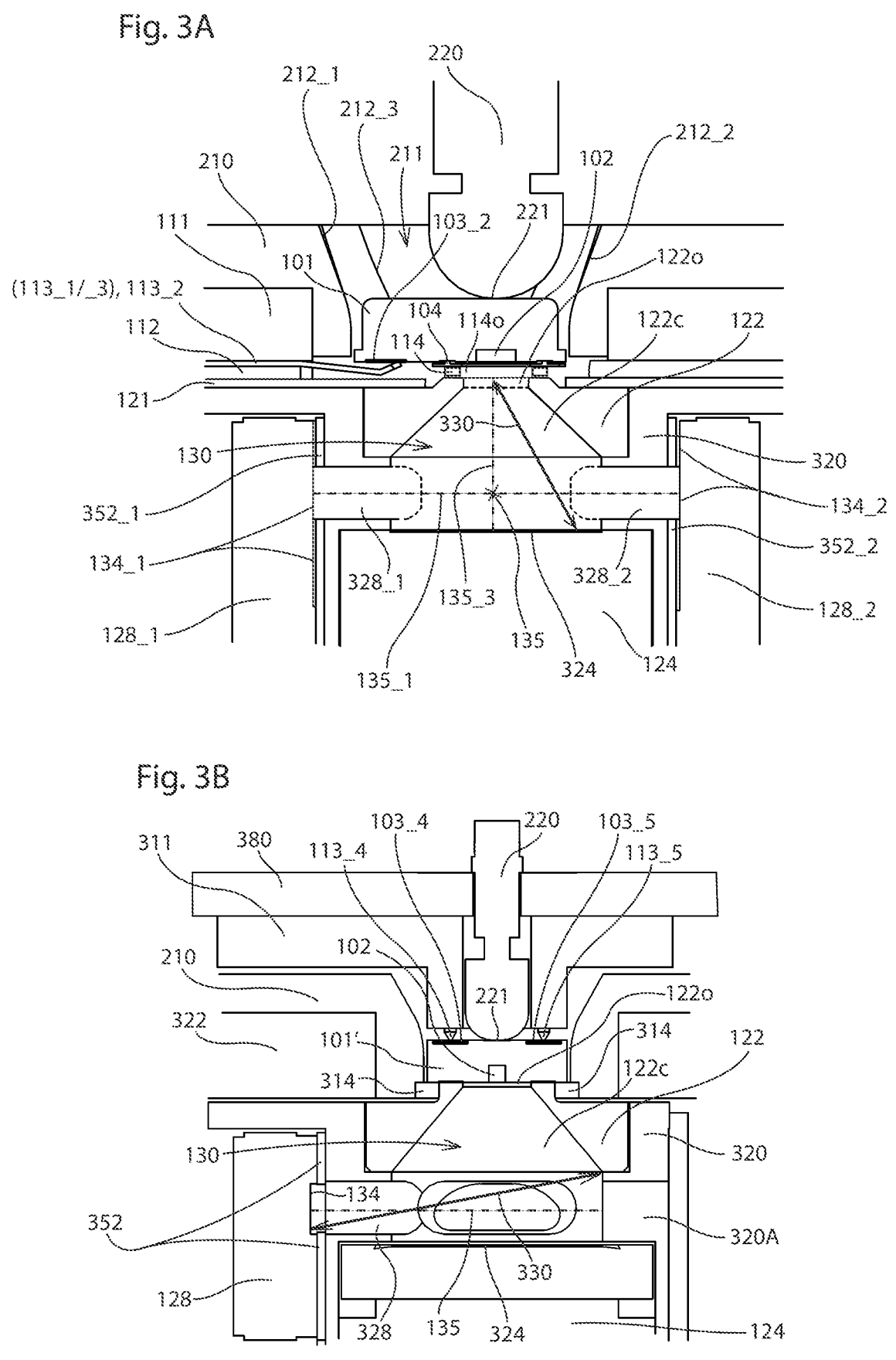

The sound generator unit 120 (only one shown) may extend opposite to a respective pogo pin 220, and each DUT 101 may be pressed from the respective pogo pin 220 towards the sound generator unit 120 (see detail A shown in FIG. 3A). A plurality of pogo pins 220 may be mounted in a pressing plate 230, wherein a number of the pogo pins 220 may correspond to a number of the DUTs 101, a number of the receptacles 211 and a number of the sound generator units 120, and a number of the sound test devices 100, respectively.

FIG. 3A shows detail A, as been depicted with FIG. 2, in an enlarged version. With its resilient pin tip 221 presses the pogo pin 220 the DUT 101 onto the insert opening 122*o* while the DUT 101 contacts towards the contact element 113_2, and to the ground ring contact 114 with its ring contact 104. A DUT opening 102 lies on top of the opening 114*o* of the contact unit, which opening 114*o* lies on the insert opening 122*o* of the insert 122, so that the DUT 101 may airtightly close the sound chamber 130. The sound chamber 130 may be an airtightly closed chamber being formed or limited by the DUT 101 with its DUT opening 102, by the insert 122 with its conical opening 122*c*, by the reference microphone 124 with its microphone membrane 324, as well as by a first speaker cave 328_1, a first speaker cave n328_1, and rectangular to the a first speaker cave n328_1, and the second speaker cave n328_2, by a third speaker cave 328_3, and a fourth speaker cave 328_4 (not shown since being arranged rectangularly; see FIG. 1C).

Hence, the sound chamber 130 may be limited by the first speaker 128_1, and the second speaker n_128_2, as well as by the third speaker n_128_3 and the fourth speaker 128_4 (the last two not shown again because of the rectangular arrangement—see FIG. 1C). The first and second speaker caves 328_1, 328_2 may extent parallel to the microphone membrane 324 and radially outward from the centre of the sound chamber 130, and towards the respective speaker membranes 134_1, 134_2. Hence, more exactly, the sound chamber 130 may be limited by the respective speaker membrane 134_1, 134_2 of each of the first, and second speaker 128_1, 128_2, and the membranes of the third speaker 128_3 and the fourth speaker128_4, respectively (compare FIGS. 1A, 1C).

Between each of the first and second speaker 128_1, 128_2 a respective first and second sound insulation 352_1, 352_2 may be arranged on the respective speaker membrane 134_1, 134_2. When the first and/or second speaker membrane 134_1, 134_2 is larger in its diameter than the respective first and/or second speaker cave 328_1, 328_2 the first and/or second sound insulation 352_1, 352_2 may comprise an insulation opening, so that sound can travel freely from the first and/or second speaker membrane 123_1, 134_2 through the first and/or second speaker cave 328_1, 328_2, respectively, and into the centre of the sound chamber 130, and/or towards the opening **122*o* of the insert 122 in order to meet the DUT opening 102**.

When the DUT 101 is pressed with its DUT opening 102 onto the opening **114*o* of the socket unit 110, and in turn the opening 114*o* of the socket unit 110 is pressed onto the opening 122*o* of the insert 122, the sound chamber 130 may become airtightly closed by the ring contact 104 of the DUT 101 being pressed on the ground ring contact 114 of the socket unit 110, and the ground ring contact 114 being pressed on the insert opening 122*o*, or a rim of the insert opening 122*o*, respectively. Within the sound chamber 130 a maximal free length 330** may be 16 mm.

The sound generator unit 120 (see also FIG. 1) may comprise a base 320 for receiving the insert 122. As been mentioned and shown with FIG. 1, is the socket unit 110 positioned on top of the sound generator unit 120. The sound generator unit 120 may comprise the insulation layer 121 on top of the base 320. The socket unit 110 may comprise the contact plate 112 integrally formed with the contact elements 113 and the ground ring contact 114, and may comprise on its top the socket cover plate 111 (see also FIG. 1).

The device carrier 210 may fit into the socket cover plate 111. As been described with FIG. 2: the device carrier 210 may comprise a plurality of receptacles 211, and each of the receptacles 211 may comprise at least two slopes, or in particular four slopes, the first slope 212_1, the second slope 212_2, a third slope 212_3, and a fourth slope 212_4. At least two of the group of the first slope 212_1, the second slope 212_2, the third slope 212_3, and the fourth slope 212_4 may be arranged skew or, in particular, rectangular to each other. E.g. the first slope 212_1 may be arranged rectangularly to the third slope 212_3, and the second slope 212_1 may be arranged rectangularly to the fourth slope 212_3. Therefore, the DUT 101 may be centred and/or aligned to properly contact to the contact elements 113, and the ground ring contact 114 of the contact plate 112 (or of the contact unit, respectively). Since a bottom side of the device carrier 210 may fit into the socket cover plate 111 of the socket unit 110 (see also FIG. 1) the complete arrangement may be adjustable by changing the socket cover plate 111 and/or the device carrier 210.

FIG. 3B shows a cross-sectional view of a sound test device in an embodiment similar to the embodiment as been depictured with FIG. 3A with the difference that only one speaker 128 is used and that the DUT 101' is contacted from a top side, being opposite to the side where the DUT opening 102 is located. Therefore, emphasize is made only to describe the different way of contacting to the DUT 101'. The sound test device 100 may comprise a contact socket 311 comprising contact elements 113_4, 113_5, formed a pogo pins, on its front side, contacting to respective contact terminals 103_4, 103_5 of the DUT 101' from the DUT top side. The contact socket 311 may be penetrated by the pogo pin 220 for pressing the DUT 101' with its DUT opening 102 onto the insert opening **122*o*. An insulation ring 314 may encircle the DUT 101' and by this may isolate the DUT 101' electrically and acoustically. The contact socket 311 may contact to a PCB 380 on its rear side. The sound test device 100 may again have a cover plate 322 engaging again with the device carrier 210. The base 320 may further comprise an extension part 320 to limit the sound chamber 130 to a smaller size. Depending on requirements of sound pressure and test frequencies the embodiment of the sound test device 100 may allow for having a smaller overall size and a better-quality test capability when using only one speaker 128**.

Figure 4:
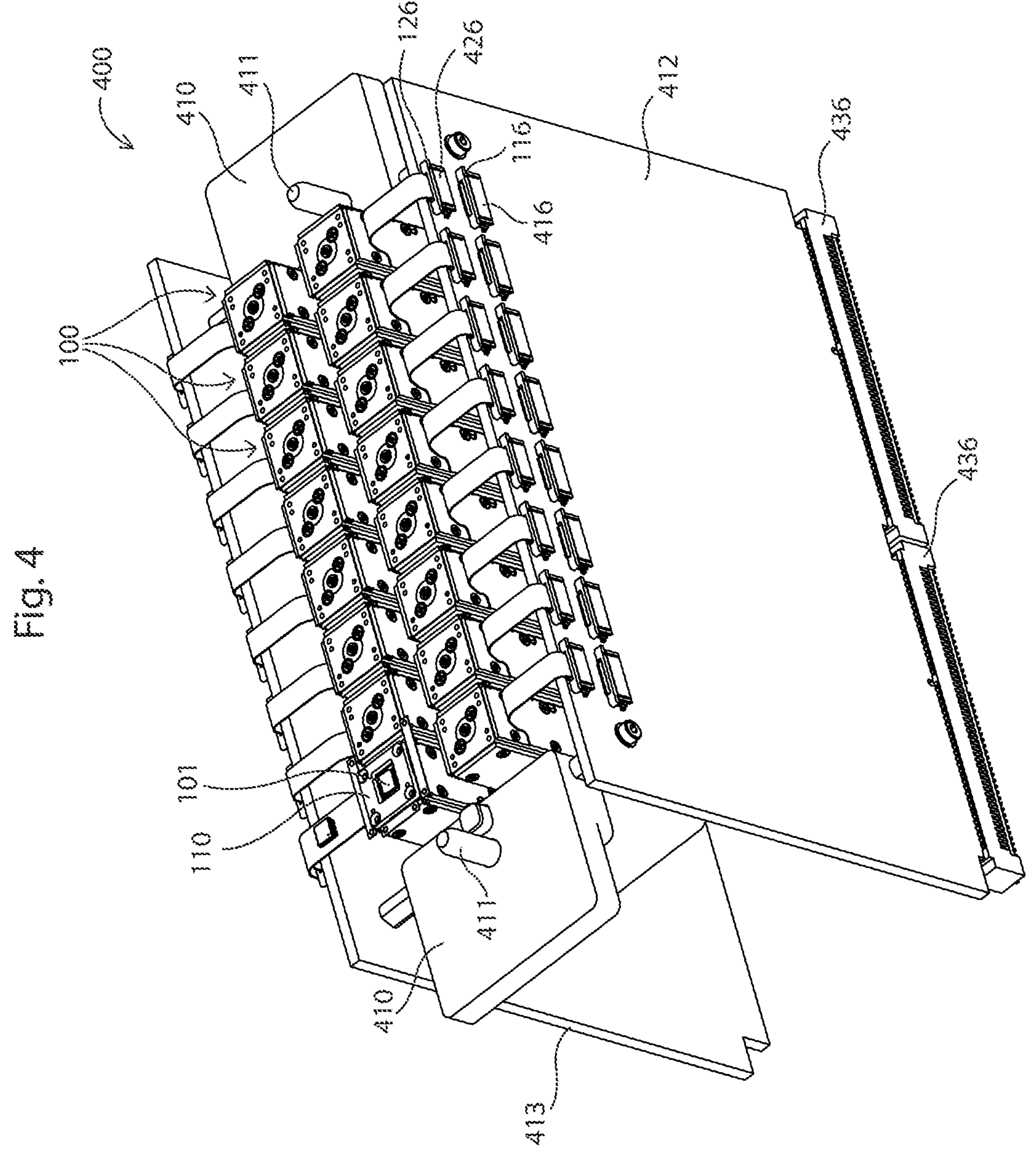
FIG. 4 shows a sound test unit in a perspective view

FIG. 4 shows a sound test unit 400 in a perspective view. The sound test unit 400 may comprise a plurality of sound test devices 100, which may be arranged in rows and columns, in particular, there may be two rows of 8 sound test devices 100. Outside of each row of sound test devices 100 there may be arranged a first DUT board 412 and a second DUT board 413. On an outer surface of the first DUT board 412 and of the second DUT board 413 there may be arranged a row of 8 sound generator connectors 426, and beneath the row of sound generator connectors 426, a row of 8 socket connectors 116. Hence, each of the sound test devices 100 being arranged on an inside of the first (and second) DUT board 412 (and 413, respectively), may be connected to the sound generator connector 426 with its sound generator plug 126 (see FIG. 1), and below to the socket connector 416 with its socket plug 116. Thus, each sound test device 100 may be connected to the respective first (and second) DUT board 412 (and 413). In particular, the respective sound generator unit 120 and the respective socket unit 110 (see FIG. 1) may be connected to the first (and second) DUT board 412 (and 413). On an opposite edge of the first (and second) DUT board 412 (and 413) may be a plurality of base plugs 436 to connect the respective DUT board 412 (413) to a handler and/or tester (not shown), described in more detail with FIG. 5. The first DUT board 412, the second DUT board 413, and the two rows of sound test devices 100 may be each mounted to a mounting plate 410 being arranged on either side of the rows and DUT boards 412, 413, respectively. Each of the two mounting plates 410 may comprise at least one alignment pin 411 for aligning the device carrier 210 (see FIG. 2).

Figure 5:
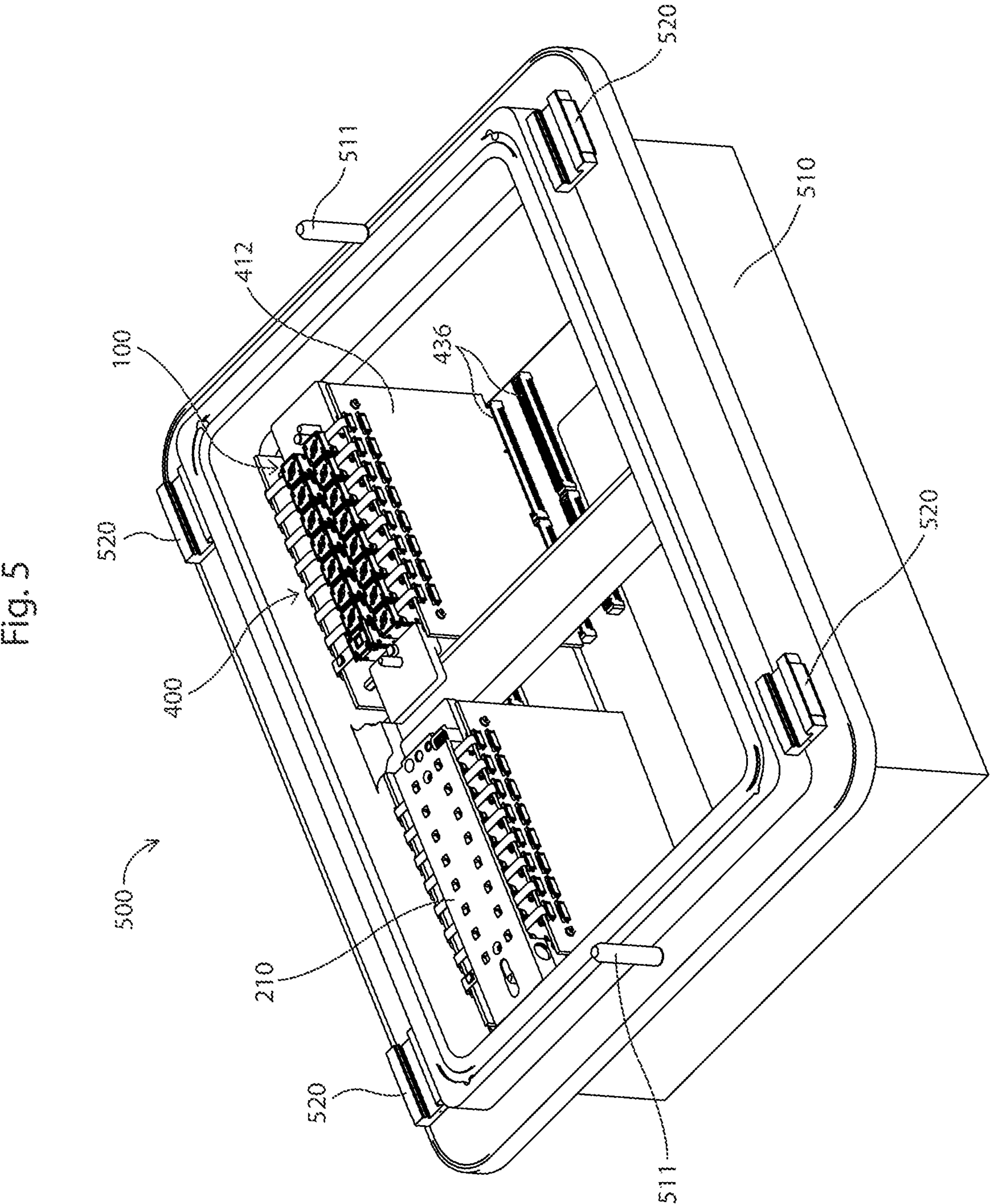
FIG. 5 shows a sound test module in a perspective view

FIG. 5 shows a sound test module 500 in a perspective view. The sound test module 500 may comprise a plurality of sound test units 400. The sound test module 500 may comprise a module base 510 and the plurality of sound test units 400 may be arranged in two rows inside the module base 510. The base plugs 436, already mentioned with FIG. 4, may be arranged on a bottom part inside the module base 510, so that the first (and second) DUT boards 412 (and 413) may be connectable with the handler and/or tester. The sound test module 500 may further comprise a plurality of mounting brackets 520 and a plurality of mounting pins 511, so that the pressing plate 230 (see FIG. 2) is mountable on top of the device carriers 210 and may press the plurality of pogo pins 220 on each of the respective DUT 101 (see again FIG. 2) by a force exerted from the mounting brackets 520 and aligned by the mounting pins 511. Handling of the device carrier 210 may be completely automated.

Figure 6:
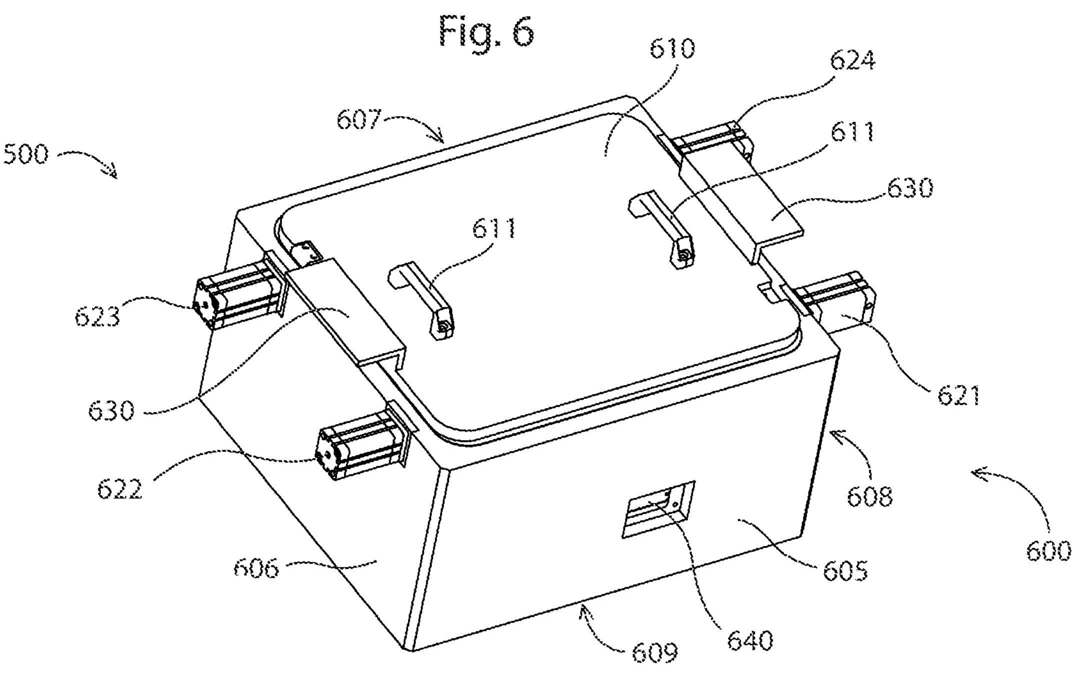
FIG. 6 shows a sound test module comprising an absorber box

FIG. 6 shows the sound test module 500, further comprising an absorber box 600 completely surrounding the module base 510 in order to prevent sound traveling towards the DUTs 101 and to prevent disturbing a sound test. The absorber box 600 may therefore comprise 4 side plates 605, 606, 607, 608, a bottom plate 609, and an absorber lid 610, which may be opened using two handles 611. Further, the absorber box 600 may comprise a window 640 on one of the four side plates 605, 606, 607, 608. In addition, the absorber box 600 may comprise at least two suspensions 630 for aligning and/or holding the absorber box 600. Four connection bars 621, 622, 623, 624 may allow for connecting each of the sound test devices 100 (via the plurality of DUT boards 412, 413) to the tester.

Figure 7:
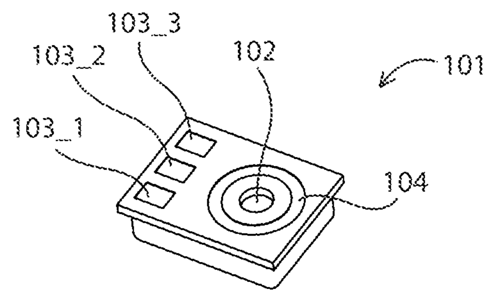
FIG. 7 shows a DUT upside down in a perspective view

FIG. 7 shows, in a perspective view, a typical DUT 101 upside down, so that the DUT opening 102 is visible. The ring contact 104 surrounds the DUT opening 102, and three contact terminals 103_1, 103_2, 103_3 are arranged on the same main surface of the DUT 101.

Figure 8:
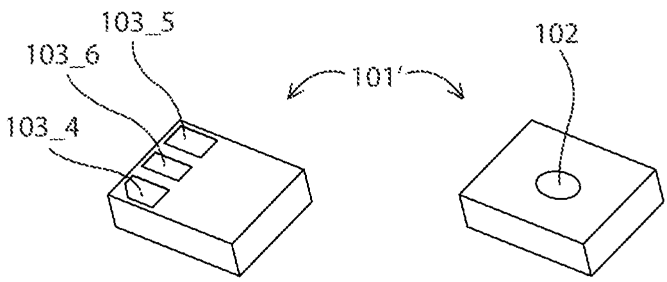
FIG. 8 shows an alternative version of a DUT in a perspective view

FIG. 8 shows, in a perspective view, a different version of a DUT 101' from two sides. The DUT opening 102 is located on an opposite side relative to the side where three contact terminals 103_4, 103_5, 103_6 are arranged. However, it may possible that contact terminals of the DUT are arranged on both sides, i.e. on the same side as the DUT opening 102 and on the opposite side compared to the location of the DUT opening 102.

The invention claimed is:

1. A sound test device for testing a DUT, wherein the sound test device comprises:

a sound chamber comprising at least one speaker cave each comprising a hollow space extending radially outwards;

a socket unit; and a sound generator unit, wherein the sound generator unit includes:

a speaker comprising a speaker membrane, an opening adapted to receive a DUT opening of the DUT, and a reference microphone comprising a microphone membrane, wherein the microphone membrane and the opening are arranged to oppose each other; and wherein the socket unit includes at least one contact element adapted to contact to a contact terminal of the DUT, and wherein the sound chamber is limited by the at least one speaker cave, the speaker membrane, the microphone membrane, and the opening.

2. The sound test device according to claim 1, further comprising an insert comprising the opening, wherein the insert further comprises a hollow conical shape tapering towards the opening and limiting the sound chamber.

3. The sound test device according to claim 2, wherein the insert is made of an electrically non-conductive ceramic material.

4. The sound test device according to claim 1, wherein the sound chamber encloses a space with a maximal free length of 16 mm.

5. The sound test device according to claim 1, wherein the at least one speaker cave extends above the microphone membrane and towards the speaker membrane.

6. The sound test device according to claim 1, wherein the sound generator unit comprises an insulation, the insulation being placed on the speaker membrane and said insulation comprising an insulation opening, so that the speaker membrane freely transmits sound through the insulation opening radially inwards to a center of the sound chamber.

7. The sound test device according to claim 1, wherein the socket unit comprises a ground ring contact being located on the opening, and wherein the ground ring contact is adapted to electrically contact to a ring contact of the DUT and to form an airtight seal with the ring contact, wherein in particular the ground ring contact and the opening form an airtight seal, when the ground ring contact is pressed onto the opening.

8. The sound test device according to claim 7, wherein the socket unit comprises a contact plate, wherein the contact plate is integrally formed with the ground ring contact, wherein the at least one contact element of the socket unit is in particular integrally formed with the contact plate.

9. The sound test device according to claim 1, wherein the socket unit comprises a contact socket including at least one contact pin, the at least one contact pin being adapted to contact to at least one opposite contact terminal of the DUT the at least one opposite contact terminal lying on an opposite side of the DUT opening.

10. The sound test device according to claim 1, wherein the socket unit comprises a socket cable formed as a flex cable and terminating in a socket plug to electrically transmit signals coming from the contact terminals.

11. The sound test device according to claim 1, further comprising a pogo pin being adapted to press the DUT onto a contact unit.

12. The sound test device according to claim 7, further comprising a pogo pin adapted to exert a force on the DUT, the exerted force being adapted to form the airtight seal between the ring contact and the ground ring contact or exerts the force to form the airtight seal between the ground ring contact and the opening.

13. The sound test device according to claim 1, wherein the sound generator unit comprises a further, second speaker comprising a further, second speaker membrane, so that the sound chamber is further limited by the further, second speaker membrane wherein in particular the speaker membrane, and the further, second speaker membrane oppose each other.

14. The sound test device according to claim 13, wherein the sound generator unit comprises a further, third speaker comprising a third speaker membrane, so that the sound chamber is further limited by the third speaker membrane, wherein the sound generator unit comprises in particular a further, fourth speaker comprising a fourth speaker membrane, so that the sound chamber is further limited by the fourth speaker membrane, wherein in particular the third speaker membrane, and the fourth speaker membrane oppose each other.

15. A method for testing a DUT, comprising:

providing a sound chamber comprising at least one speaker cave, a socket unit, and a sound generator unit, the sound generator unit comprising a speaker comprising a speaker membrane, an opening, and a reference microphone comprising a microphone membrane, wherein the microphone membrane and the opening are arranged to oppose each other, wherein the socket unit includes at least one contact element, and wherein the sound chamber is limited by the at least one speaker cave, the speaker membrane, the microphone membrane, and the opening;

receiving a DUT opening of the DUT on the opening; and contacting the least one contact element to at least on contact terminal of the DUT, when receiving the DUT.

* * * * *